(12) United States Patent
Rix et al.

(10) Patent No.: US 11,929,692 B2
(45) Date of Patent: Mar. 12, 2024

(54) VIBRATIONAL ENERGY HARVESTERS WITH REDUCED WEAR

(71) Applicant: 8POWER LIMITED, Cambridge (GB)

(72) Inventors: Antony Rix, Cambridge (GB); James Horne, Warrington (GB); Yu Jia, Chester (GB)

(73) Assignee: 8POWER LIMITED, Cambridge (GB)

( * ) Notice: Subject to any disclaimer, the term of this patent is extended or adjusted under 35 U.S.C. 154(b) by 864 days.

(21) Appl. No.: 16/963,141

(22) PCT Filed: Jan. 30, 2019

(86) PCT No.: PCT/GB2019/050260
§ 371 (c)(1),
(2) Date: Jul. 17, 2020

(87) PCT Pub. No.: WO2019/150109
PCT Pub. Date: Aug. 8, 2019

(65) Prior Publication Data
US 2021/0126558 A1   Apr. 29, 2021

(30) Foreign Application Priority Data
Feb. 1, 2018   (GB) ...................................... 1801675

(51) Int. Cl.
*H02N 2/18* (2006.01)
*H02K 5/24* (2006.01)
*H02K 33/00* (2006.01)

(52) U.S. Cl.
CPC .................................... *H02N 2/188* (2013.01)

(58) Field of Classification Search
CPC ........... H02N 2/188; H02K 33/00; H02K 5/24
(Continued)

(56) References Cited

U.S. PATENT DOCUMENTS 9,048,419 B2   6/2015   Xu et al.
2004/0007662 A1   1/2004   Sidorin
(Continued)

FOREIGN PATENT DOCUMENTS

CN   104883091 A   9/2015
EP   3043464 A1   7/2016
(Continued)

OTHER PUBLICATIONS

Aichao Yang, Ping Li,a) Yumei Wen, Caijiang Lu, Xiao Peng, Wei He, Jitao Zhang, Decai Wang, and Feng Yang, High-efficiency broadband acoustic energy harvesting using Helmholtz resonator and dual piezoelectric cantilever beams, Jun. 2014 (, p. 85, 066103-1 AIP Publishing LLC. China.
(Continued)

*Primary Examiner* — Jose A Gonzalez Quinones
(74) *Attorney, Agent, or Firm* — Maynard Nexsen PC; Todd Allen Serbin

(57) ABSTRACT

The proposed vibrational energy harvester comprises a frame (118), a mass (114) coupled to first and second primary flexures (110, 112) which are configured to flex and allow the mass to move in a first direction (130), a plurality of secondary flexures (120, 122) which are configured to flex and allow the mass to move in a different second direction (132), and a transduction assembly configured to convert movement of the mass and flexures into electrical energy, preferably of electrodynamic or piezoelectric type. Each of the primary flexures is coupled to a secondary flexure at a position spaced from the mass. The resonant frequency of torsional vibration modes can thereby be raised to a frequency higher than the frequency band of ambient vibrations, which effectively prevents the energy harvester from vibrating in undesirable torsional modes that would result in wear between components.

20 Claims, 10 Drawing Sheets

(58) Field of Classification Search
USPC .................................. 310/15, 36, 51, 81
See application file for complete search history.

(56) References Cited

U.S. PATENT DOCUMENTS

| | | |
|---|---|---|
| 2006/0217776 A1 | 9/2006 | White et al. |
| 2008/0136292 A1 | 6/2008 | Thiesen |
| 2010/0176694 A1 | 7/2010 | Eckstein |
| 2012/0206016 A1 | 8/2012 | Ayazi et al. |
| 2015/0180374 A1 | 6/2015 | Herder et al. |
| 2016/0211439 A1* | 7/2016 | Najafi .............. H10N 30/1071 |
| 2017/0144191 A1* | 5/2017 | Mao ..................... B06B 1/045 |

FOREIGN PATENT DOCUMENTS

| | | |
|---|---|---|
| GB | 2446685 A | 8/2008 |
| WO | 2012/015301 A2 | 2/2012 |

OTHER PUBLICATIONS

S P Beeby, M J Tudor and N M White, Energy harvesting vibration sources for microsystems applications, IMeas. Sci. Technol. 17, Oct. 26, 2006, pp. R175-R195, IOP Publishing Ltd, UK.

Bo Li a, Fu-Li Hsiaoa,b, Chengkuo Leea, Sensors and Actuators A: Physical, Elsevier Journal, Mar. 17, 2011, pp. 352-361 pages, Elsevier B.V., China.

Adnan Harb, Energy harvesting: State-of-the-art, Elsevier Journal, Jul. 10, 2010, pp. 2641-2654, Elsevier Ltd., United Arab Emirates.

Rashed Mahameed1, Nipun Sinha2, Marcelo B Pisani1 and Gianluca Piazza1, Dual-beam actuation of piezoelectric AIN RF MEMS switches monolithically integrated with AIN contour-mode resonators, Journal of Micromechanics and Microengineering, Sep. 5, 2008, 11 Pages, vol. 18, IOP Publishing, UK.

Seok-Min Jung and Kwang-Seok Yuna, Energy-harvesting device with mechanical frequency-up conversion mechanism for increased power efficiency and wideband operation, Applied Physics Letters, Mar. 19, 2010, p. 96, 111906-1, American Institute of Physics., Korea.

Vinod R Challa, M G Prasad and Frank T Fisher, Towards an autonomous self-tuning vibration energy harvesting device for wireless sensor network applications, Smart Materials and Structures, Dec. 3, 2010, 11 pages, IOP Publishing, UK & USA.

Wanlu Zhou, Gopinath Reddy Penamalli and Lei Zuo, An efficient vibration energy harvester with a multi-mode dynamic magnifier, Smart Materials and Structures, Dec. 20, 2011, 9 pages, IOP Publishing, UK & USA.

Wei-Jiun Su, Jean Zu and Yang Zhu, Design and development of a broadband magnet-induced dual-cantilever piezoelectric energy harvester, Journal of Intelligent Material Systems and Structures, 2013, pp. 430-442,I. vol. 25 (4), Sage Pub, UK.

Weiqing Yang1,2,†, Jun Chen1,†, Guang Zhu1, Xiaonan Wen1, Peng Bai1, Yuanjie Su1,2, Yuan Lin2, and Zhonglin Wang1,3, Harvesting vibration energy by a triple-cantilever based triboelectric nanogenerator, Nano Research, 2013, pp. 880-886, vol. 6(12), Tsinghua University Press and Springer-Verlag, Berlin Heidelberg.

Yu Jia1,2, Sijun Du1 & Ashwin A. Seshia1, Twenty-Eight Orders of Parametric Resonance in a Microelectromechanical Device for Multi-band Vibration Energy Harvesting, Nature.com/scientificreports, Jul. 22, 2016, pp. 1-8, |DOI.

D Zhu1 and S P Beeby, A broadband electromagnetic energy harvester with a coupled bistable structure, Journal of Physics: Conference Series, 2013, p. 1-5, vol. 476, IOP Publishing, UK, Sage Publications, Los Angeles, CA.

Alper Erturk, Jamil M. Renno and Daniel J. Inman, Modeling of Piezoelectric Energy Harvesting from an L-shaped Beam-mass Structure with an Application to UAVs, Journal of Intelligent Material Systems and Structures, Mar. 2009, pp. 529-544, vol. 20, Sage Publications, Los Angeles USA.

Engel, Emily et al, Enhanced Vibration Energy Harvesting Using Nonlinear Oscillations, Franklin W. Olin College of Engineering, vol. 9493, 8 pages.

Moser, URS, International Search Report and Written Opinion, PCT/GB2019/050260, 13 pages, dated May 7, 2019.

Fellows, Jody, GB Search Report, GB1801675.8, 3 pages, dated Jul. 24, 2018.

* cited by examiner

VIBRATIONAL ENERGY HARVESTERS WITH REDUCED WEAR

CROSS REFERENCE TO RELATED APPLICATIONS

This application is a National Phase of PCT Patent Application No. PCT/GB2019/050260 having an International filing date of Jan. 30, 2019, which in turn claims priority to GB patent application 1801675.8, filed Feb. 1, 2018, the contents of both are hereby incorporated by reference in their entireties.

BACKGROUND

The invention relates to vibrational energy harvesters and in particular to vibrational energy harvesters capable of parametric excitation, in which unwanted modes of vibration are constrained. By limiting the vibration possible in particular directions, wear caused by friction between parts of the energy harvester can be significantly reduced. In addition, some of the clearance required between parts can be reduced, allowing for an overall reduction in the size of a vibrational energy harvester.

Vibrational energy harvesters operate by converting ambient vibrational energy into electrical energy. This energy can be used to power local devices, such as wireless sensors. Various underlying transduction techniques can be used in vibrational energy harvesters, such as electrostatic transduction, electromagnetic transduction and piezoelectric transduction. In all cases, it is the movement of a mass in the energy harvester as result of ambient vibrations that is converted into electrical energy.

One challenge for vibrational energy harvesters is making them small enough for practical purposes while still producing enough output power. In order to reduce the size of a vibrational energy harvester, it would be desirable to minimise the clearances between moving parts of the energy harvester. Some clearance is required in order to allow for movement and minimise friction. In some environments there is a broad band of frequencies of ambient vibration and the vibrations can be in many different directions. In those environments, a moving mass in a vibrational energy harvester may be excited into many different modes of vibration and may be moved in different directions. In that case, significant clearance between the moving mass and adjacent parts of the energy harvester may be required to eliminate friction and wear between the parts. However, some of the modes of vibration may not be useful for energy harvesting.

One class of vibrational energy harvester that shows promise in providing efficient and broadband energy harvesting capability is parametric vibrational energy harvesters. In a parametric vibrational energy harvester it is typically desirable to allow an oscillating mass to move in two orthogonal directions to allow for both direct and parametric mode oscillations to be used for energy harvesting. However, it is desirable to constrain movement in a third orthogonal direction to reduce wear and tear on the system.

A flexure within a vibrational energy harvester typically has transverse, lateral and torsional modes at frequencies near the lower resonant frequency modes. But for vibrational energy harvesters with a transducer adapted to harness energy from transverse modes of oscillation, the other modes may yield minimal energy recovery and may adversely increase the wear and tear of the oscillatory system. The wear and tear can occur from twisting of the spring joints as well as collision of the mass with the stator or housing. Furthermore, the presence of undesirable lateral or torsional modes close to the frequency of the modes of operation, can make it more difficult for the system to enter into a desired mode of operation.

It would be desirable to provide a vibrational energy harvester in which a moving mass is effectively constrained to move only in some modes of vibration without incurring significant energy losses. In particular, it would be desirable to allow for movement of a mass within a vibrational energy harvester in two dimensions while effectively constraining movement in the third dimension.

SUMMARY

The invention is defined in the appended independent claims, to which reference should be made. Preferred aspects of the invention are defined in the dependent claims.

In a first aspect of the invention, there is provided a vibrational energy harvester comprising:
  a frame;
  first and second primary flexures;
  a mass, the mass being independently coupled to both the first and second primary flexures;
  wherein the first and second primary flexures are configured to flex to allow the mass to move in a first direction, and are separated from one another in the first direction;
  a plurality of secondary flexures, each of the primary flexures being fixed to a secondary flexure at a position spaced from the mass and coupling the primary flexure to the frame or to the mass, wherein each of the secondary flexures is configured to flex to allow the mass to move in a second direction different to the first direction; and
  a transduction assembly configured to convert movement of the mass and primary and secondary flexures into electrical energy.

By fixing the mass to two flexures that are spaced in the first direction, the resonant frequency of the torsional modes of vibration of the energy harvester can be raised to a frequency higher than the band of frequencies covered by ambient vibrations. This effectively constrains the vibrational energy harvester from vibrating in undesirable torsional modes that would result in wear between components.

The first and second primary flexures are separated from one another by an air, or other fluid, gap or by a vacuum gap. The first and second primary flexures are configured to flex to in the first direction but substantially inhibit flexing in directions orthogonal to the first direction.

Advantageously, none of the flexures in the vibrational energy harvester are configured to flex in a third direction orthogonal to the first direction and to the second direction. Advantageously, the mass provides a rigid coupling between the first and second primary flexures.

The first and second primary flexures may extend substantially orthogonal to the first direction. The first and second primary flexures may extend parallel to one another.

The first and second primary flexures may each have a length extending in a direction orthogonal to the first direction, and a thickness extending in the first direction, and a width extending in a direction orthogonal to the length and to the thickness, wherein the length and the width are greater than the thickness. The width may extend in the third direction. Preferably, the distance between the first and second primary flexures in the first direction is at least 25% of the width of one of the first and second primary flexures, and more preferably at least 50% of the width of one of the first and second primary flexures.

Each of the primary flexures may be in an unstrained configuration simultaneously.

The primary flexures may be cantilever flexures. Each of the primary flexures may have a fixed end coupled to the frame through one or more secondary flexures and a free end fixed to the mass. The fixed end and the free end of each primary flexure may be separated in a length direction.

Alternatively, the primary flexures may each have opposite first and second ends, separated in a length direction, the opposite first and second ends coupled to the frame through one or more secondary flexures, and wherein the mass is fixed to a mid-point of each of the primary flexures.

The primary flexures may be membrane flexures. As used herein, the term membrane flexure means a flexure that is constrained or attached to a frame at more than one position, typically on opposite sides of the mass. A membrane flexure may be a clamped-clamped beam. A membrane flexure has a thickness much smaller than its length and width. Use of a membrane flexure will typically provide good axial constraint for the mass.

The membrane flexure may be substantially disc shaped and may be circular or elliptical. Other shapes are also possible, such as rectangular or hexagonal. Where a primary flexure or flexures is a membrane flexure, the mass may be fixed to a central portion of each of the membrane flexure and the frame fixed to a peripheral portion of the membrane flexure at two or more positions through the secondary flexures.

Each of the membrane flexures may have a thickness extending in the first direction that is much smaller than both a length and width of the membrane flexure. In particular, each of the membrane flexures may have a thickness extending in the first direction that is at least 10 times smaller than both a length and width of the membrane flexure, and more preferably at least 25 times smaller than both a length and width of the membrane flexure.

Alternatively, each of the primary flexure or flexures may be an inverted-membrane flexure, with the mass fixed to a peripheral portion of each of the flexures at two or more different positions and the frame fixed to a central portion of each of the flexures between the two or more different positions through a plurality of secondary flexures.

The secondary flexures may each have a length extending in the first direction, and a thickness extending in the second direction, and a width extending in the third direction, wherein the length and the width are greater than the thickness. At least two of the secondary flexures may be spaced from one another in the second direction.

All of the secondary flexures may be in an unstrained configuration simultaneously.

Each of the secondary flexures may extend in a direction orthogonal or oblique to the primary flexure. All of the primary and secondary flexures may pass through a common plane parallel with the first direction. Each of the secondary flexures may extend from a primary flexure in the same direction.

Each of the secondary flexures may comprise a cantilever beam.

The primary flexures may be coupled to the frame solely through one or more of the secondary flexures.

Each of the primary and secondary flexures may be formed from a resilient material such a spring steel or copper.

In some embodiments, each primary flexure may be fixed to one secondary flexure to form an L-shaped flexure assembly. A first L-shape flexure assembly, comprising the first primary flexure, may be parallel to a second L-shape flexure assembly, comprising the second primary flexure. The mass may be fixed between the first and second primary flexures.

The first and second L-shape flexure assemblies may be arranged so that a first secondary flexure connected to the first primary flexure is positioned on the same side of the mass to a second secondary flexure connected to the second primary flexure. Alternatively, the first and second L-shape flexure assemblies may be arranged so that a first secondary flexure connected to the first primary flexure is positioned on an opposite side of the mass to a second secondary flexure connected to the second primary flexure.

The first and second L-shape flexure assemblies may be identical or may have different dimensions or material properties.

In other embodiments, each primary flexure may be fixed to two secondary flexures, one secondary flexure fixed to one end of the primary flexure and another secondary flexure connected to an opposite end of the primary flexure, to form a C-shaped flexure assembly. The mass may be fixed to the primary flexure at a position between the two ends. A first C-shape flexure assembly, comprising the first primary flexure, may be parallel to a second C-shape flexure assembly, comprising the second primary flexure. The first and second C-shape flexure assemblies may be identical to one another or may have different dimensions or material properties.

Alternatively, each of the secondary flexures coupled to the first primary flexure may extend in a direction opposite to each of the secondary flexures coupled to the second primary flexure. The first and second L-shape flexure assemblies may be arranged so that a first secondary flexure connected to the first primary flexure is positioned on the same side of the mass to a second secondary flexure connected to the second primary flexure. The two L-shape flexure assemblies then together form a T-shape, with the mass at the base of the T-shape and the top ends of the T-shape each connected to the frame.

In another embodiment, four L-shape flexure assemblies may each be connected to the same mass and arranged in an H-shape. This is effectively two T-shape arrangements on opposite sides of the mass.

Other combinations of L-shaped flexure assemblies are possible with spaced primary flexures. For example, rather than having both primary flexures fixed directly to the mass, it is possible for one L-shape flexure assembly to have a primary flexure fixed directly to the mass and another L-shape flexure assembly to have a primary flexure coupled to the mass through a secondary flexure.

The secondary flexures may extend obliquely relative to the primary flexure to which they are connected. In this case, rather than the primary and secondary flexures forming an L-shape flexure assembly, they may be described as forming a V-shape flexure assembly. A V-shape flexure may replace the L-shape flexure assembly in any of the arrangements described above.

Each secondary flexure may be fixed to a primary flexure at a bend or junction. Alternatively, one or more of the secondary flexures may form a continuous curved structure with the primary flexure to which it is fixed. In this case, there may be no clear boundary between the primary flexure and the secondary flexure, but the curved structure provides the same function as a primary flexure attached to a secondary flexure at a distinct bend or junction, with different portions of the curved structure allowing for displacement of the mass in different directions. The energy harvester may comprise a structure, intermediate these two extremes, where primary and secondary flexures are joined by an intermediate curved structure. One or more of the primary and secondary flexures may be formed as a single, integral component. The single, integral component may be bent or shaped to form a primary and one or more secondary flexures.

The first and second primary flexures may be substantially identical. The secondary flexures may be substantially identical to each other or may be different to each other.

Each primary flexure together with the secondary flexures fixed to it may form an auto-parametric resonator. The vibrational energy harvester may oscillate in a first mode in which the mass moves primarily in the first direction or the second direction, and a second mode in which the mass moves primarily in the other of the first direction and the second direction. In one case, by suitable design of the flexures, a resonant frequency of the second mode may be matched to the resonant frequency of the first mode, so that when the flexures are driven at or close to resonance in the second mode, the flexures are driven in parametric resonance in the first mode. In another case, by suitable design of the flexures, a resonant frequency of the first mode may be matched to the resonant frequency of the second mode, so that when the flexures are driven at or close to resonance in the first mode, the flexures are driven in parametric resonance in the second mode.

If a resonant frequency of one of the first and second modes is $\omega_1$ and a resonant frequency of the other of the first and second modes is $\omega_2$, then $\omega_1$ may be substantially or approximately equal to $2\omega_2/n$, where n is an integer. This frequency relationship enables one mode of oscillation to drive the flexures in parametric resonance in another mode.

In embodiments in which the primary flexures are membranes, at least three secondary flexures, and preferably at least four secondary flexures, may be fixed to each of the primary flexures. The secondary flexures may be spaced about a periphery of the membrane flexure. The secondary flexures may be cantilever beams.

The secondary flexures may be configured to allow the mass to move in a plurality of different second directions orthogonal to the first direction. This may be achieved by spacing the secondary flexures even around the periphery of the membrane. This allows vibration in any direction to be harvested by the vibrational energy harvester.

Any one or more of the primary flexures may comprise two or more layered flexure elements, with each flexure element in a flexure parallel to each other but spaced from each other in the first direction. Similarly, any one or more of the secondary flexures may comprise two or more layered flexure elements, with each flexure element in a flexure parallel to each other but spaced from each other in the second direction. Each flexure element may comprise a sheet of spring material, such as spring steel. Each flexure element may be spaced from an adjacent flexure element by one or more shims or spacers. The shims or spacers may have a thickness of the same order of magnitude as the flexure elements. Each flexure element may be substantially identical. The spacing distance between flexure elements in the thickness direction is advantageously less than 25% of the width of any of the flexure elements. The use of a layered structure of flexure elements to form a flexure can increase the maximum displacement the flexure can attain for a given length of flexure, while remaining within fatigue limits. Using a different number of layers in a layered structure also allows different stiffness flexures to be made using only one, standard thickness of flexure element. The use of shims or spacers between the flexure elements reduces friction between adjacent flexure elements.

The transduction assembly may comprise a coil and at least one magnet positioned adjacent to the coil. Advantageously, the at least one magnet forms all or part of the mass and the coil is fixed to the frame adjacent to the at least one magnet.

The transduction assembly may comprise a piezoelectric element on one or more of the flexures. Membrane flexures are particularly advantageous for piezoelectric transduction, as they can offer a relatively large transduction area.

The vibrational energy harvester may be a microelectromechanical systems (MEMS) device. In particular, the primary and secondary flexures, together with the frame and the mass may be formed from silicon, and advantageously from a single crystal of silicon.

In a further aspect of the invention, there is provided a vibrational energy harvester comprising:
  a frame;
  first and second flexures each having a primary portion,
  a mass, the mass being coupled to the primary portion of both the first and second flexures;
  wherein the primary portions of first and second flexures are configured to flex to allow the mass to move in a first direction, and are separated from one another in the first direction;
  the first and secondary flexures each having one or more secondary portions, each extending from a primary portion at a position spaced from the mass, and coupling the primary portion to the frame, wherein each of the secondary portions is configured to flex to allow the mass to move in a second direction different to the first direction; and
  a transduction assembly configured to convert movement of the mass and primary and secondary flexures into electrical energy.

One or both of the flexures may comprise a continuously curved structure so that there is no clear boundary between the primary and secondary portions. One or both of the flexures may comprise a sharp bend or junction between the primary and secondary portions.

The first and second primary flexures are separated from one another by an air, or other fluid, gap or by a vacuum gap.

Features described in relation to one aspect of the invention may be applied to other aspects of the invention.

A vibrational energy harvester in accordance with the invention may be constructed to ensure that the resonant frequency of undesirable torsional and lateral modes of vibration, orthogonal to the first and second directions, have a significantly higher resonant frequency that the desirable modes of vibration in the first and second directions. In particular the resonant frequency of undesirable torsional and lateral modes of vibration may be outside the frequency band of ambient vibrations expected to be experienced by the vibrational energy harvester. The suppression of unwanted modes of vibration in this way improves the chance of the vibrational energy harvester entering parametric resonance, and reduces the risk of wear due to mechanical contact of parts resulting from excitation of the undesirable modes of vibration.

DRAWINGS

Embodiments of the invention are described in detail, by way of example only, with reference to the accompanying drawings, in which.

DESCRIPTION

Figure 1:
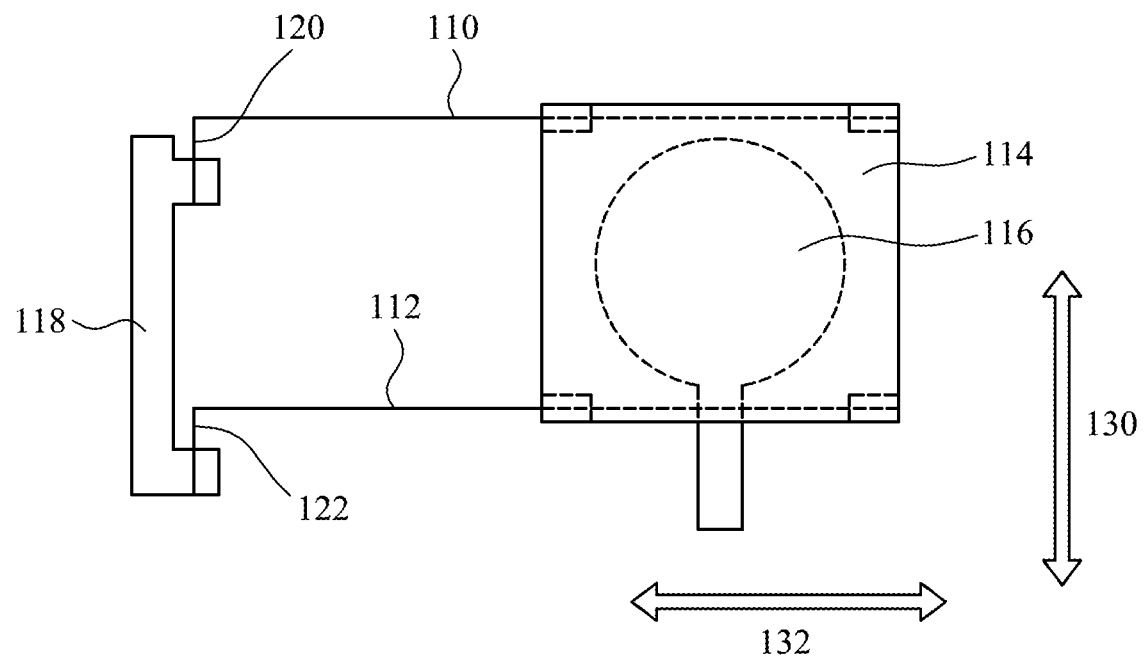
FIG. 1 is a side view of a first embodiment of the invention.
Figure 2:
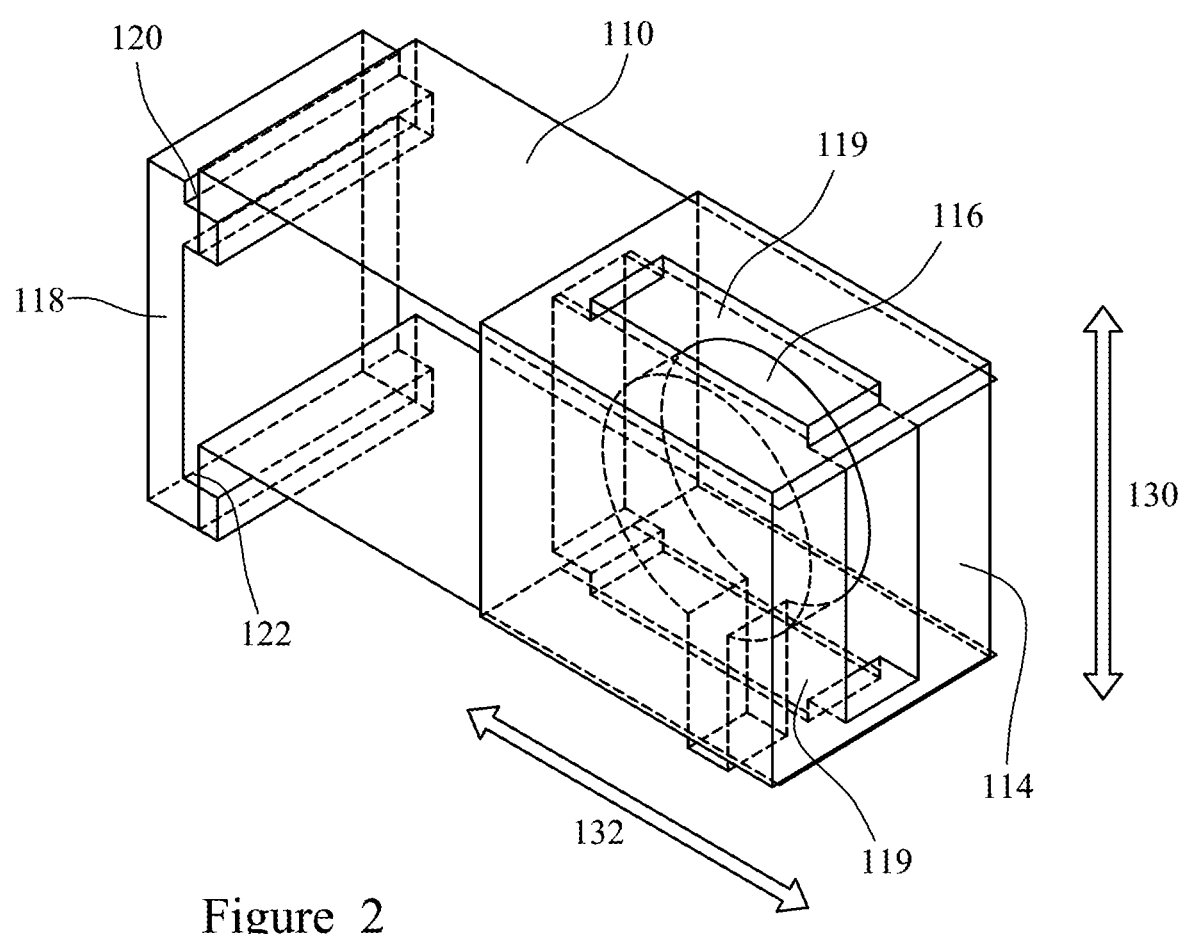
FIG. 2 is a perspective view of the first embodiment of the invention.

FIG. 1 is a side view of a vibrational energy harvester in accordance with a first embodiment of the invention. FIG. 2 is a perspective view of the vibrational energy harvester of FIG. 1, with the elements shown in transparent form for ease of understanding. The energy harvester comprises a mass 114, including permanent magnets, coupled to a frame 118 through a pair of parallel flexure assemblies 110, 120, 112, 122, and a coil 116 fixed relative to the frame and positioned adjacent to the magnets. A pair of magnets may be arranged on each side of the coil with their poles in an opposed relationship to provide a well contained magnetic field across the coil. The magnets move on the flexure assemblies as a result of ambient vibrations. The magnets and coil together form a transducer assembly. Motion of the magnets on the flexure assembly provides a varying magnetic flux across the coil, inducing an electrical current in the coil. The electrical current can be used to charge an electrical energy store or to power one or more electrical devices.

Each flexure assembly comprises a primary flexure 110, 112 fixed to the mass 114 and a secondary flexure 120, 122 fixed between a primary flexure and the frame 118. The primary flexures are cantilever beams configured to flex to allow the mass to move in a first direction, as indicated by arrow 130. Each primary flexure may include an aperture 119, visible in FIG. 2, to allow the flexure to pass the coil 116 without interference. Each primary flexure has a thickness in the first direction, a length extending in a second direction, indicated by arrow 132, and a width extending in a third direction orthogonal to both the first direction and the second direction. When the vibrational energy harvester undergoes vibration in the first direction, the mass moves in the first direction, driven by the motion of the directly excited primary flexures. The primary flexures 110, 112 are parallel to one another and have a substantially identical structure to one another. They are both directly fixed to the mass 114. The mass provides a rigid coupling between the two primary flexures and the spacing of the primary flexures raises the frequency of torsional modes when compared to the frequency of torsional modes for each primary flexure when not coupled to one another by the mass.

Each flexure assembly also comprises a secondary flexure 120, 122, which is a cantilever beam. The secondary flexures 120, 122 are parallel to one another and have a substantially identical structure to one another. One end of each secondary flexure is connected to an opposite end of each primary flexure to the mass and an opposite end of each secondary flexure is connected to the frame 118. The secondary flexures extend between the two ends in the first direction. Each secondary flexure has a thickness in the second direction, a length extending in the first direction, and a width extending in a third direction orthogonal to both the first direction and the second direction. When the vibrational energy harvester undergoes vibration in the first direction, indicated by arrow 130, the mass moves in the first direction, driven by the directly excited primary flexures. This is a first mode of vibration. When the vibrational energy harvester undergoes vibration in the second direction, indicated by arrow 132, the mass moves in the second direction, driven by the directly excited secondary flexures. This is a second mode of vibration.

The primary and secondary flexures are also designed so that vibration of the flexures in the second mode can parametrically excite the first mode. A parametric mode of operation can provide more efficient conversion of vibrational energy into electrical energy. Parametric resonance occurs when there is an excitation that introduces a periodic modulation in at least one energy storage parameter of a system. The periodic modulation must have a defined frequency relationship with the natural frequency of the system. Parametric excitation, unlike direct excitation, is usually perpendicular and not parallel to the direction of the driving displacement. In order to achieve parametric resonance from this excitation, the excitation frequency w needs to be approximately $2\omega_0/n$; where $\omega_0$ is the natural frequency of the resonator and n is the number of order (submultiple). Therefore, the first order (principal) parametric resonance can be attained when the excitation frequency is twice the natural frequency. Additionally, there is a prerequisite of a non-zero initial displacement in order to 'push' the system out of stable equilibrium. When parametric resonance is achieved, it is potentially capable of reaching higher amplitudes and broader frequency response than a conventional linear or direct resonator at its fundamental mode of resonance.

In order to make a parametric mode of vibration more likely, the resonant frequencies of the first and second modes are matched. If the resonant frequency of the first mode is $\omega_1$ and the resonant frequency of the second mode is $\omega_2$, then $\omega_2$ may be substantially equal to $2\omega_1/n$ where n is an integer. This frequency relationship enables the oscillation of the second mode to parametrically excite the first mode.

In the embodiment shown in FIGS. 1 and 2 each secondary flexure is integral with a primary flexure. The flexures are formed from a sheet of spring steel that is shaped to form the primary and secondary flexures. In the example of FIGS. 1 and 2, the primary flexures extend orthogonal to the secondary flexures when in a rest position, however, they may be at a different, oblique angle to one another.

Other topologies of primary and secondary flexures are possible that provide the same benefit in terms of moving the resonant frequency of undesirable modes of vibration away from the band of frequencies of operation.

Figure 3:
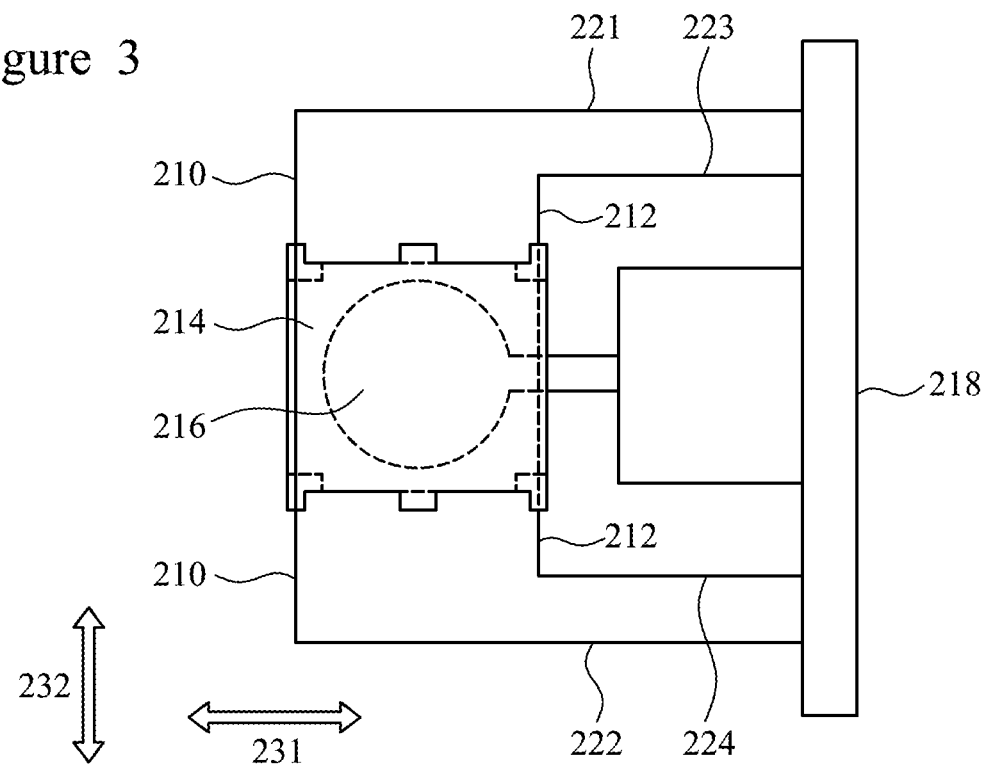
FIG. 3 is a side view of a second embodiment of the invention.
Figure 4:
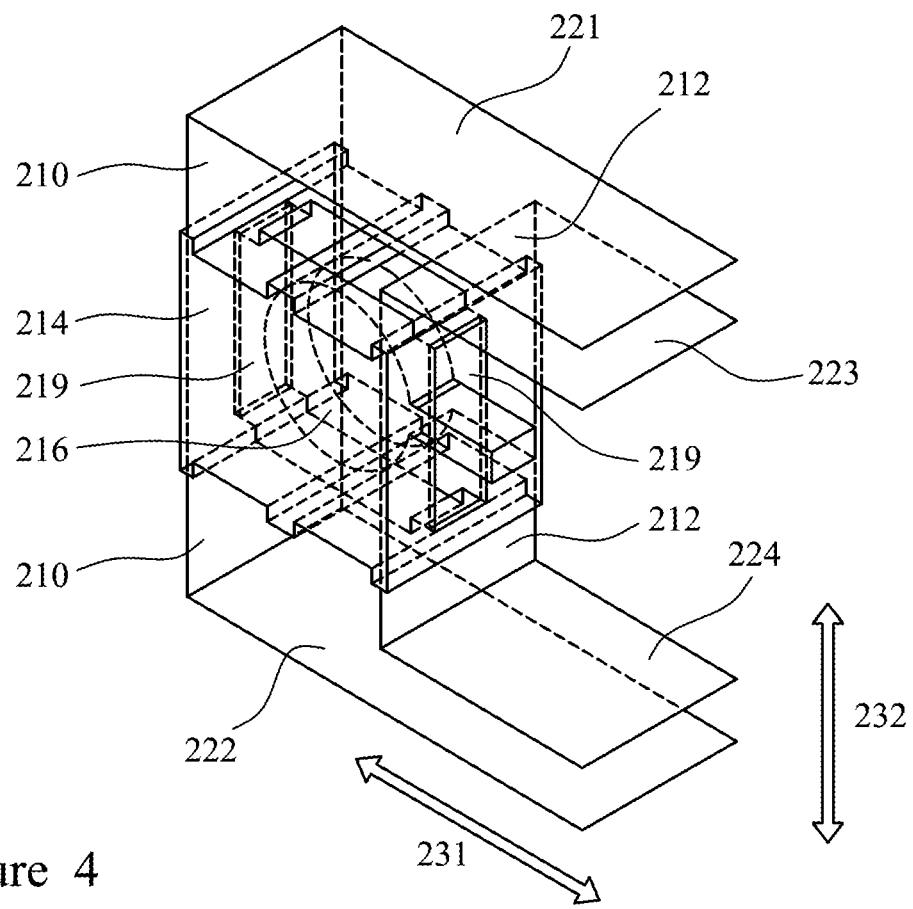
FIG. 4 is a perspective view of the second embodiment of the invention.

FIGS. 3 and 4 illustrate a second embodiment in accordance with the invention. FIG. 3 is side view of a vibrational energy harvester in accordance with a second embodiment of the invention. FIG. 4 is a perspective view of the vibrational energy harvester of FIG. 3, with the elements shown in transparent form for ease of understanding.

In the second embodiment, the proof mass and magnet assembly 214 is again coupled to a frame by a pair of flexure assemblies. Each flexure assembly comprises primary flexures 210, 212 fixed to the mass and magnet assembly 214 and a pair of secondary flexures 221, 222 and 223, 224 connected between the primary flexure and the frame, with one secondary flexure connected to each end of the primary flexure. Each of the secondary flexures extends from a primary flexure in the same direction, so that the two primary flexures are parallel to each other and the four secondary flexures are parallel to each other. The primary flexures are parallel but axially spaced from another. The overall shape of the flexure assemblies can be described as CC-shaped as there are 2 C-shaped flexure assemblies.

In this embodiment, the mass and magnet assembly is fixed to a central portion of each primary flexure 210, 212. Each primary flexure extends beyond the proof mass and magnet assembly on opposite sides of the proof mass and magnet assembly. However, the same topology could be achieved using two shorter primary flexures in place of each primary flexure, one shorter primary flexure extending from the proof mass and magnet assembly on one side and the other shorter primary flexure extending from the proof mass and magnet assembly on the opposite side. Each primary flexure includes an aperture 219, visible in FIG. 4, to allow the flexure to pass the coil 216 without interference.

In the embodiment shown in FIGS. 3 and 4, the two primary flexures have a different length to each other and the two pairs of secondary flexures have a different length to each other. Their other dimensions or material properties may also be different to each other in order to tune the resonant modes of vibration of the energy harvester and to adjust the loci of the mass and flexures.

In the embodiment shown in FIGS. 3 and 4, each secondary flexure is integral with a primary flexure. Each flexure assembly is formed from a sheet of spring steel that is shaped to form the primary and secondary flexures. In the example of FIGS. 3 and 4, the primary flexures extend orthogonal to the secondary flexures when in a rest position, however, they may be at a different, oblique angle to one another.

When the vibrational energy harvester undergoes vibration in the first direction, indicated by arrow 231 the mass and magnet assembly moves in the first direction, driven by the directly excited flexures in a first mode of vibration. When the vibrational energy harvester undergoes vibration in the second direction, indicated by arrow 232 the mass and magnet assembly moves in the second direction, driven by the directly excited flexures in a second mode.

The primary and secondary flexures are also designed so that oscillation of the flexures in the first mode can drive the flexures in parametric resonance in the second mode. A parametric mode of operation can provide more efficient conversion of vibrational energy into electrical energy. In order to make a parametric mode of vibration more likely the resonant frequencies of the first and second modes are matched. If a resonant frequency of the second mode is $\omega_2$ and a resonant frequency of the first mode is $\omega_1$, then $\omega_2$ may be substantially equal to $2\omega_1/n$ where n is an integer. This frequency relationship enables the first mode to parametrically excite the second mode.

Figure 5:
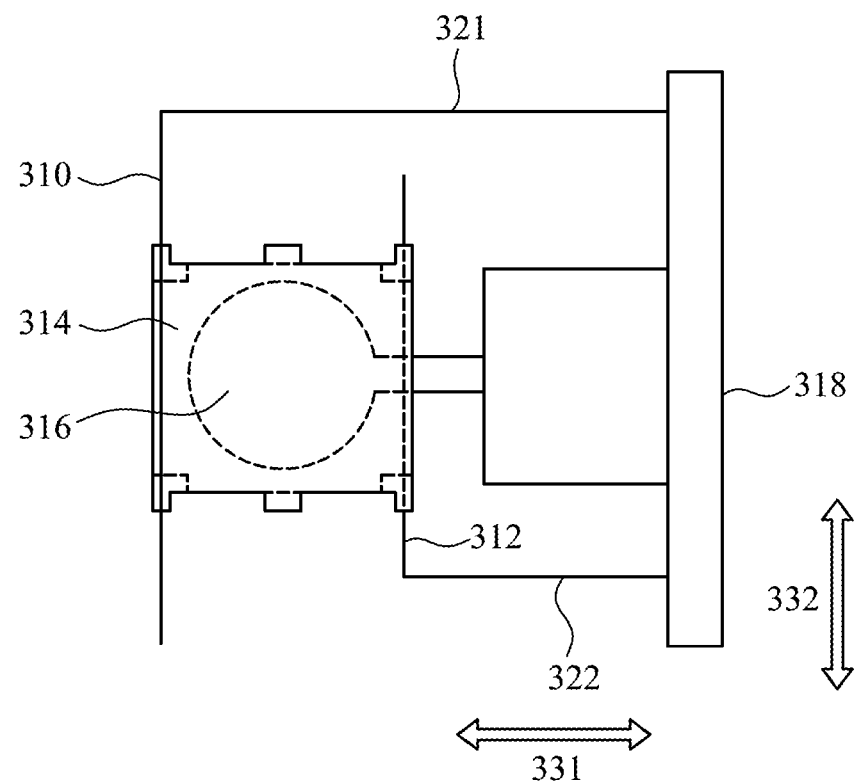
FIG. 5 is a side view of a third embodiment of the invention.
Figure 6:
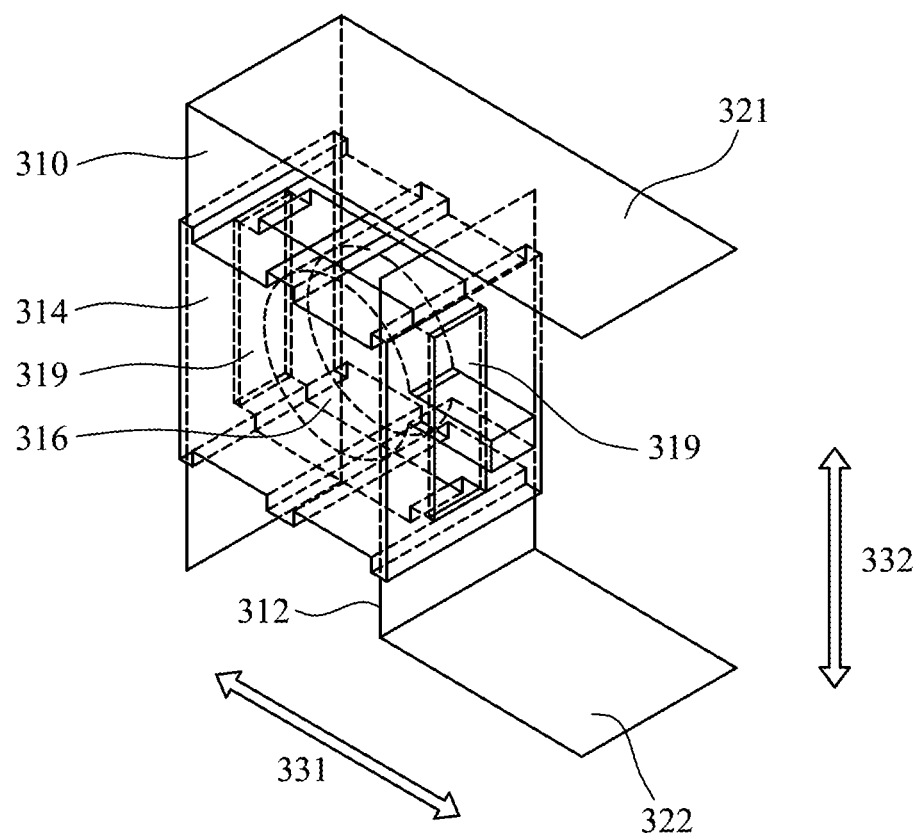
FIG. 6 is a perspective view of the third embodiment of the invention.

FIGS. 5 and 6 illustrate a third embodiment in accordance with the invention. FIG. 5 is a side view of a vibrational energy harvester in accordance with a third embodiment of the invention. FIG. 6 is a perspective view of the vibrational energy harvester of FIG. 5, with the elements shown in transparent form for ease of understanding.

The third embodiment, shown in FIGS. 5 and 6, is similar to the embodiment shown in FIGS. 3 and 4, but with two secondary flexures removed. In this way, the stiffness of the vibrational energy harvester is changed and the loci of the first and second modes is changed.

In the third embodiment, the proof mass and magnet assembly 314 is coupled to a frame 318 by parallel primary flexures 310 and 312. In this embodiment the mass and magnet assembly 314 is fixed to a central portion of each primary flexure 310 and 312. The mass provides a rigid coupling between the two primary flexures. This raises the frequency of torsional modes of the primary flexures when compared to torsional modes for each primary flexure when they are not coupled to one another. Each primary flexure extends beyond the proof mass and magnet assembly on opposite sides of the proof mass and magnet assembly. Each primary flexure includes an aperture 319, visible on FIG. 6, to allow the flexure to pass coil 316 without interference.

Secondary flexures 321 and 322 are connected between the primary flexures and the frame 318. Each secondary flexure is integral with a primary flexure. The flexure assemblies are each formed from a sheet of spring steel that is shaped to form a primary and secondary flexure assembly. In the example of FIGS. 5 and 6, the primary flexures extend orthogonal to the secondary flexures when in a rest position. The overall shape of the flexure assemblies can be described as asymmetric LL-shaped as there are 2 L-shaped flexures in different orientations.

As in the embodiment of FIGS. 3 and 4, the two flexure assemblies have different dimensions to one another, but may be configured to have the same or similar resonant frequencies in the desired modes of operation.

When the vibrational energy harvester undergoes vibration in a first direction, indicated by arrow 331, the mass and magnet assembly moves in the same direction as the vibration, driven by the directly excited primary flexures. When the vibrational energy harvester undergoes vibration in the second direction, indicated by arrow 332 the mass and magnet assembly moves in the second direction, driven by the directly excited secondary flexures.

The primary and secondary flexures are also designed so that oscillation of the flexures in the first direction 331 can drive the flexures in parametric resonance, such that they vibrate in direction 332. A parametric mode of operation can provide more efficient conversion of vibration energy into electrical energy. In order to make a parametric mode of vibration more likely, the resonant frequencies of the first and second modes are matched. If a resonant frequency of the first mode is $\omega_1$ and a resonant frequency of the second mode is $\omega_2$, then $\omega_1$ may be substantially equal to $2\omega_2/n$ where n is an integer. This frequency relationship enables the first mode to parametrically excite the second mode.

Figure 7:
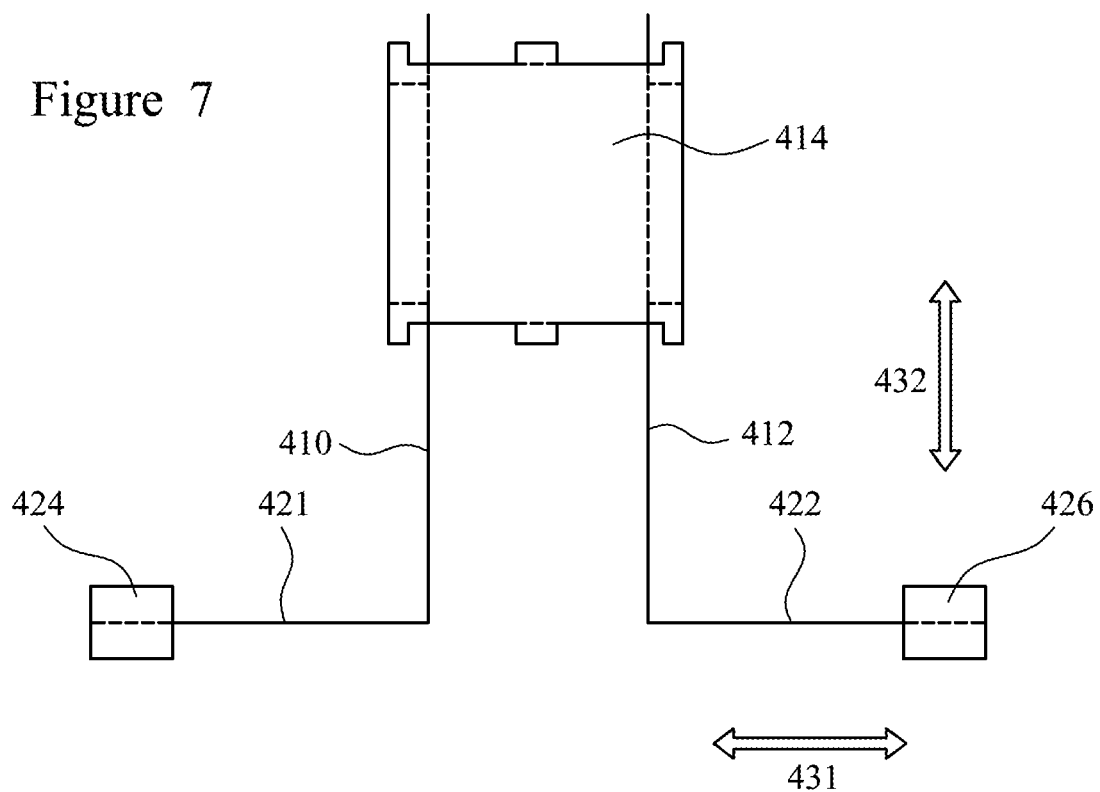
FIG. 7 is a side view of a fourth embodiment of the invention.
Figure 8:
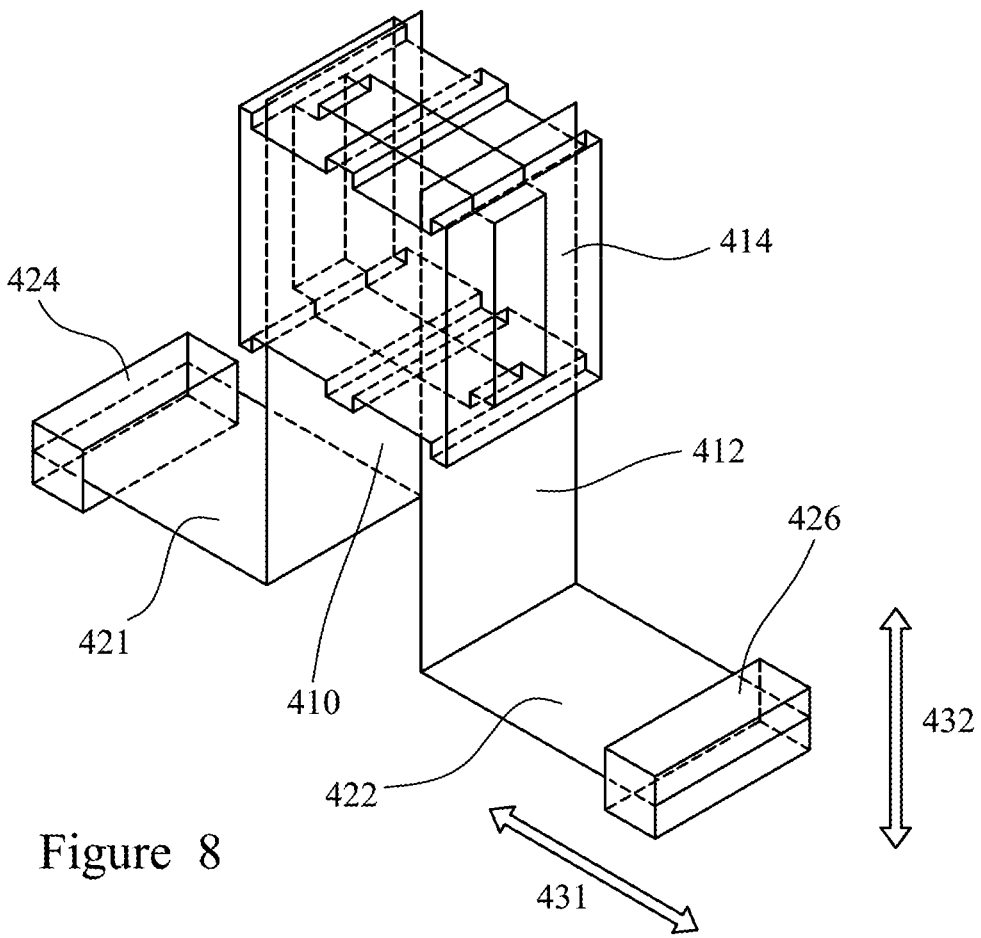
FIG. 8 is a perspective view of the fourth embodiment of the invention.

FIGS. 7 and 8 illustrate a fourth embodiment in accordance with the invention. FIG. 7 is a side view of a vibrational energy harvester in accordance with a fourth embodiment of the invention. FIG. 8 is a perspective view of the vibrational energy harvester of FIG. 7, with the elements shown in transparent form for ease of understanding.

In the fourth embodiment, the proof mass assembly 414 comprises an electromagnetic transducer consisting of a pair of magnets arranged on each side of a coil (not shown) with their poles in a opposed relationship to provide a well contained magnetic field across the coil. Motion of the magnets on the flexure assembly provides a varying magnetic flux across the coil, inducing an electrical current in the coil.

The proof mass assembly 414 is fixed at an end portion of primary flexures 410 and 412. However, each primary flexure may extend beyond the proof mass assembly on opposite sides of the proof mass assembly. The primary flexures are parallel but spaced from one another and the proof mass assembly provides a rigid coupling between the two primary flexures. This raises the frequency of torsional modes when compared to torsional modes for each primary flexure alone.

Secondary flexures 421 and 422 are connected between the primary flexures and anchors 424 and 426. Each of the secondary flexures extends orthogonally from the primary flexures and in an opposite direction to one other. Each secondary flexure is integral with a primary flexure. As in the previous embodiment, each flexure assembly is formed from a sheet of spring steel that is shaped to form the primary and secondary flexures. In the example of FIGS. 7 and 8, the primary flexures extend orthogonal to the second flexures when in a rest position. The dimensions of the two flexures assemblies are substantially identical. The overall shape of the flexure assemblies can therefore be described as a T-shape.

When the vibrational energy harvester undergoes vibration in the first direction, indicated by arrow 431, in a first mode the proof mass assembly moves in direction 431, driven by the directly excited primary flexures. When the vibrational energy harvester undergoes vibration in the second direction, indicated by arrow 432, in a second mode the mass and proof mass assembly moves in the second direction, driven by the directly excited secondary flexures.

The primary and secondary flexures are also designed so that oscillation of the flexures in second direction 432 can drive the flexures in parametric resonance, such that they move in first direction 431. A parametric mode of operation can provide more efficient conversion of vibration energy into electrical energy. In order to make a parametric mode of vibration more likely the resonant frequencies of the first and second modes are matched. If a resonant frequency of the first mode is $\omega_1$ and a resonant frequency of the second mode is $\omega_2$, then $\omega_2$ may be substantially equal to $2\omega_1/n$ where n is an integer. This frequency relationship enables the second mode to parametrically excite the first mode.

Figure 9:
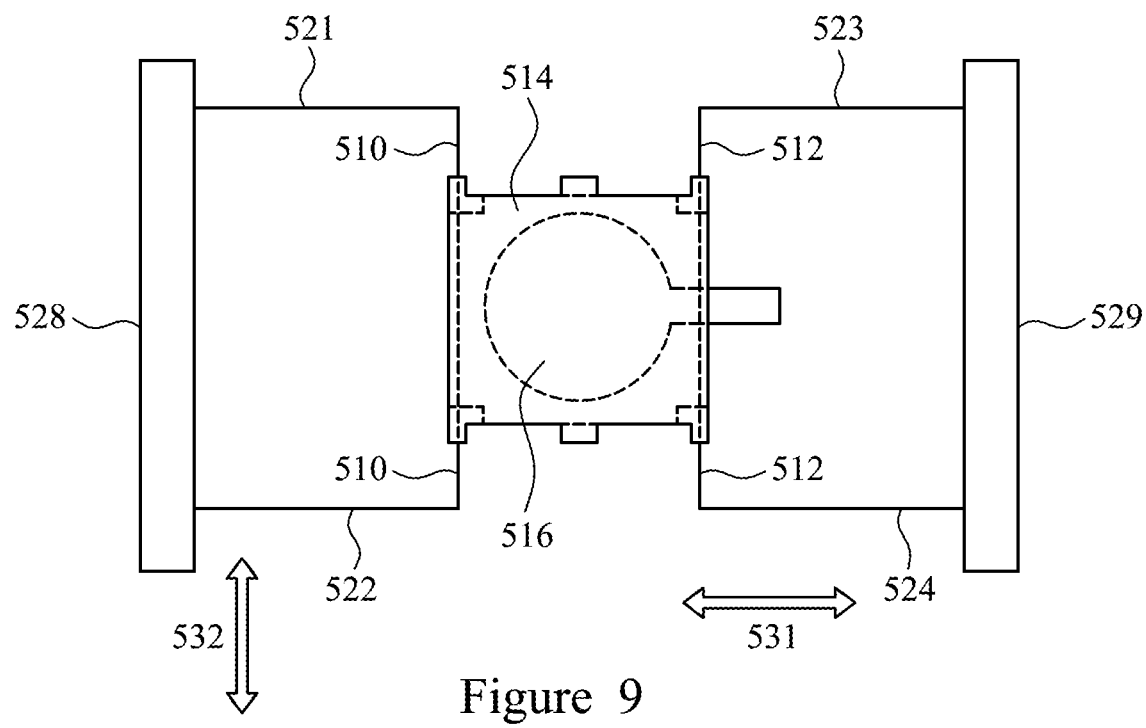
FIG. 9 is a side view of a fifth embodiment of the invention.
Figure 10:
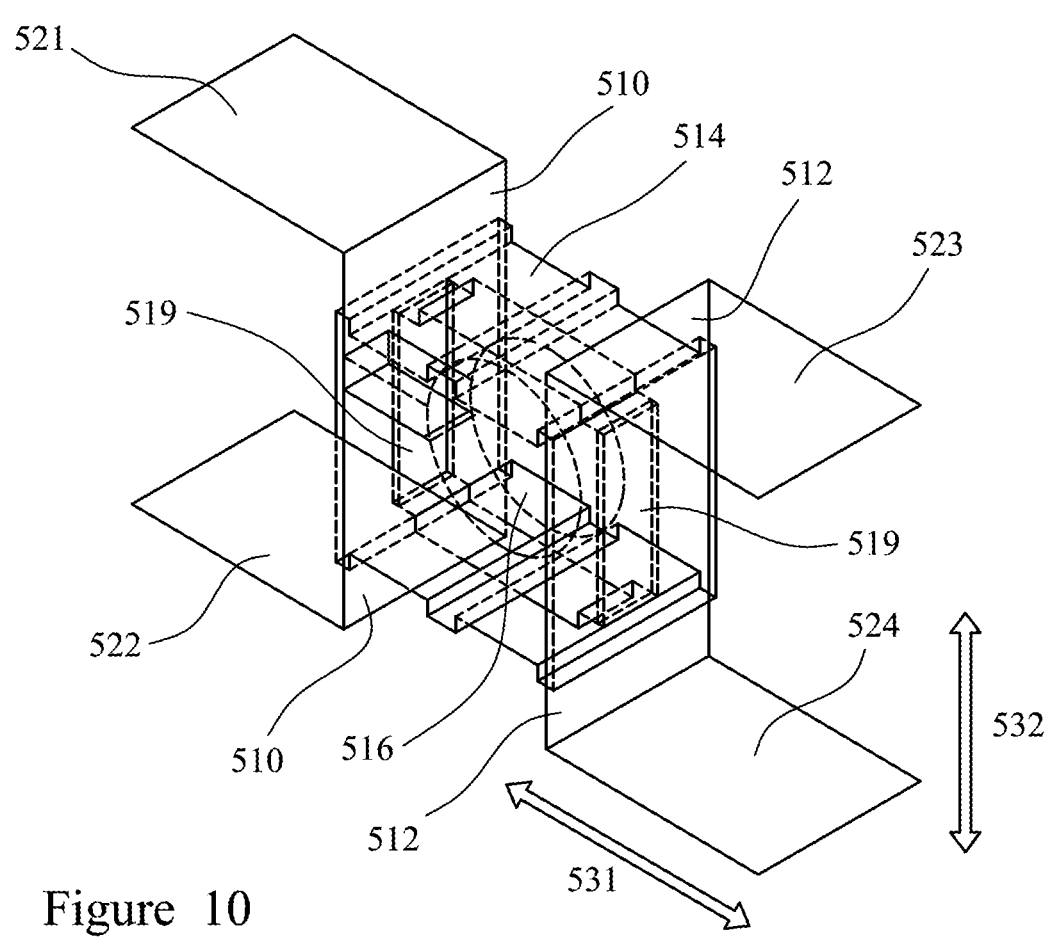
FIG. 10 is a perspective view of the fifth embodiment of the invention.

FIGS. 9 and 10 illustrate a fifth embodiment in accordance with the invention. FIG. 9 is a side view of a vibrational energy harvester in accordance with a fifth embodiment of the invention. FIG. 10 is a perspective view of the vibrational energy harvester of FIG. 9, with the elements shown in transparent form for ease of understanding.

In the fifth embodiment, the mass and magnet assembly 514 is fixed to a central portion of each primary flexure 510 and 512. Each primary flexure extends beyond the proof mass and magnetic assembly on opposite sides of the proof mass and magnet assembly. The primary flexures are spaced cantilever beams, which are configured to flex to allow the mass to move in a first direction, as indicated by arrow 531. Each primary flexure includes an aperture 519, visible on FIG. 10, to allow the flexure to pass coil 516 without interference.

In the embodiment shown in FIGS. 9 and 10, each secondary flexure is integral with a primary flexure. Each flexure assembly is formed from a sheet of spring steel that is shaped in a C-shape to form the primary and secondary flexures. The primary flexures extend orthogonal to the secondary flexures when in a rest position. Secondary flexures 521 and 522 connect primary flexure 510 to frame 528. Secondary flexures 523 and 524 connect primary flexure 512 to frame 529. Secondary flexure 521 is parallel to secondary flexure 522. Secondary flexure 523 is parallel to secondary flexure 524. The two flexure assemblies 522, 510, 521 and 524, 512, 523 are mirror images of one another and have the same dimensions. The overall shape of the flexures assemblies can be described as H-shaped. The H-shaped assembly may be achieved using four L-shaped flexure assemblies or 2 C-shaped flexure assemblies.

When the vibrational energy harvester undergoes vibration in a first direction, indicated by arrow 531, in a first mode the mass and magnet assembly moves in direction 531, driven by the directly excited primary flexures. When the vibrational energy harvester undergoes vibration in second direction 532, in a second mode, the mass and magnet assembly moves in direction 532, driven by the directly excited secondary flexures.

The primary and secondary flexures are also designed so that oscillation in the first mode can parametrically excite the second mode, such that the mass and magnet assembly 514 vibrates in second direction 532. In order to make a parametric mode of vibration more likely the resonant frequencies of the first and second modes are matched. If a resonant frequency of the first mode is $\omega_1$ and a resonant frequency of the second mode is $\omega_2$, then $\omega_1$ may be substantially equal to $2\omega_2/n$ where n is an integer. This frequency relationship enables the first mode to parametrically excite the second mode.

Figure 11:
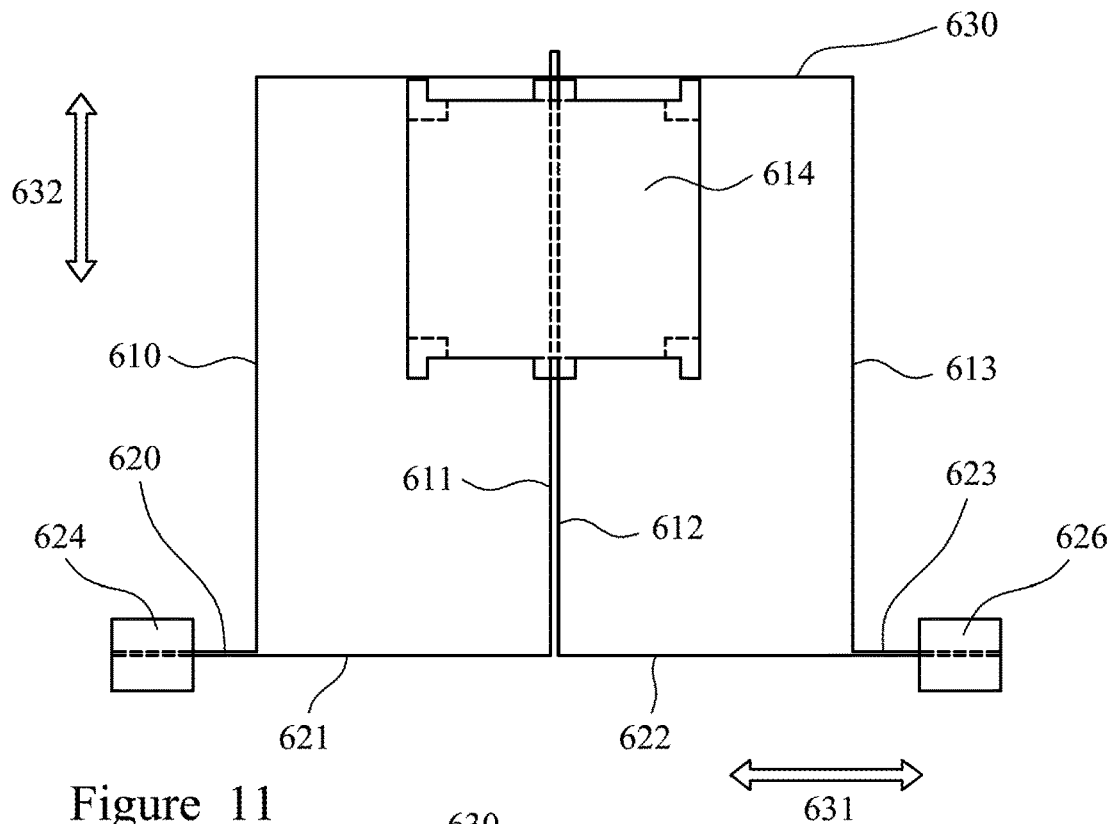
FIG. 11 is a side view of a sixth embodiment of the invention.
Figure 12:
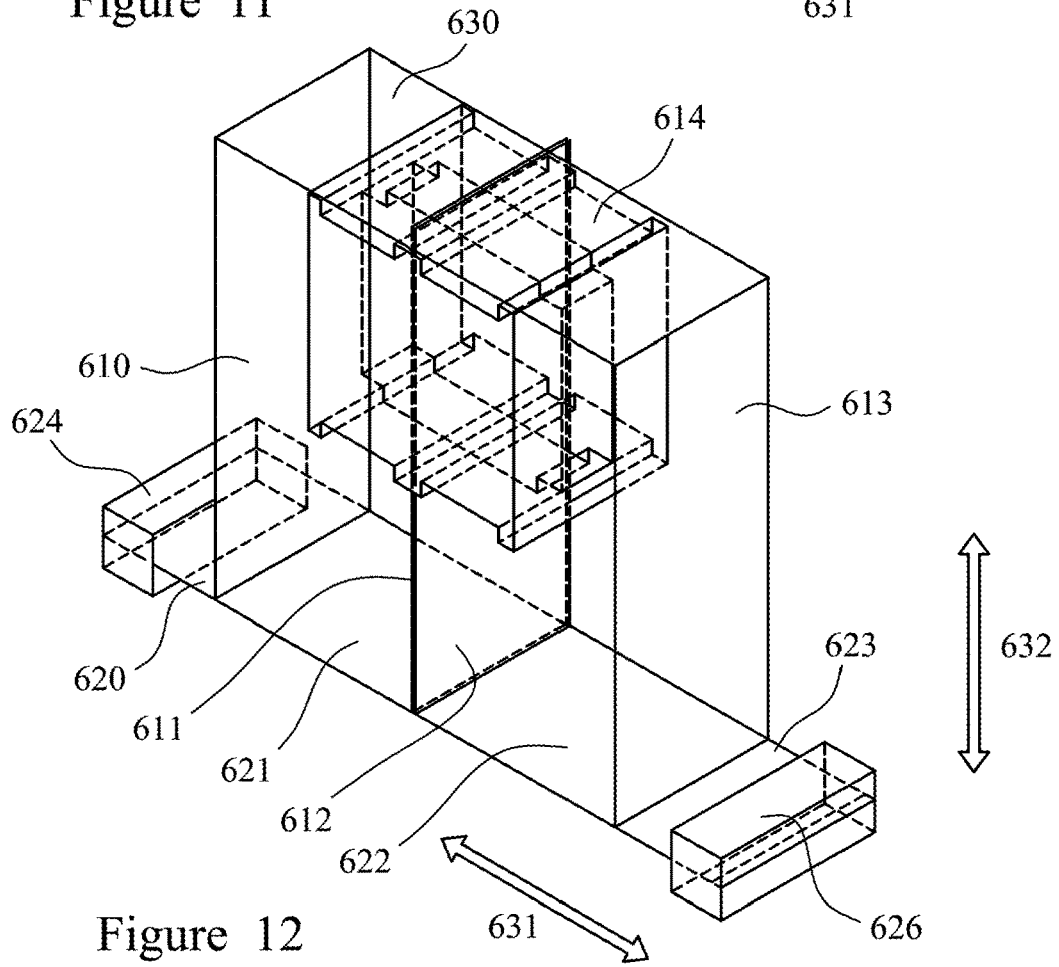
FIG. 12 is a perspective view of the sixth embodiment of the invention.

FIGS. 11 and 12 illustrate a sixth embodiment in accordance with the invention. FIG. 11 is a side view of the vibrational energy harvester. FIG. 12 is a perspective view of the vibrational energy harvester of FIG. 11, with the elements shown in transparent form for ease of understanding.

In the sixth embodiment, the proof mass assembly 614 comprises an electromagnetic transducer consisting of a pair of magnets arranged on each side of a coil with their poles in an opposed relationship to provide a well contained magnetic field across the coil. Motion of the magnets on the flexure assembly provides a varying magnetic flux across the coil, inducing an electrical current in the coil.

Parallel primary flexures 611 and 612 are fixed to the proof mass assembly and extend beyond the proof mass assembly. Primary flexures 611 and 612 may alternatively be spaced apart in the first direction, indicate by arrow 631. Primary flexures 610 and 613 extend parallel to primary flexures 611 and 612 and are spaced from primary flexures 611, 612 in the first direction. Primary flexures 610 and 613 are fixed to the proof mass assembly through additional secondary flexure 630, described below.

Secondary flexures 620, 621, 622 and 623 extend from anchors 624 and 626. The anchors 624 and 626 are located on opposite sides of the proof mass assembly. Each secondary flexure is integral with a corresponding primary flexure. In FIGS. 11 and 12, secondary flexure 620 is integral with primary flexure 610, secondary flexure 621 is integral with primary flexure 611, secondary flexure 622 is integral with primary flexure 612 and secondary flexure 623 is integral with primary flexure 613. The primary flexures extend orthogonal to the secondary flexures when in a rest position. An additional secondary flexure 630 is joined to the free ends of primary flexures 610, 611, 612 and 613 and to the proof mass assembly 614. The overall shape of the flexure assemblies can be described as a combination of T and C-shapes.

When the vibrational energy harvester undergoes vibration in a first direction, indicated by arrow 631, the proof mass assembly moves in direction 631, in a first mode driven by the directly excited primary flexures. When the vibrational energy harvester undergoes vibration in a second direction, indicated by arrow 632, the proof mass assembly moves in direction 632, in a second mode driven by the directly excited secondary flexures.

The primary and secondary flexures are also designed so that oscillation in the second mode can drive the flexures in parametric resonance in the first mode. In order to make a parametric mode of vibration more likely the resonant frequencies of the first and second modes are matched. If a resonant frequency of the primary flexure is $\omega_1$ and a resonant frequency of the secondary flexure is $\omega_2$, then $\omega_2$ may be substantially equal to $2\omega_1/n$ where n is an integer.

Figure 13:
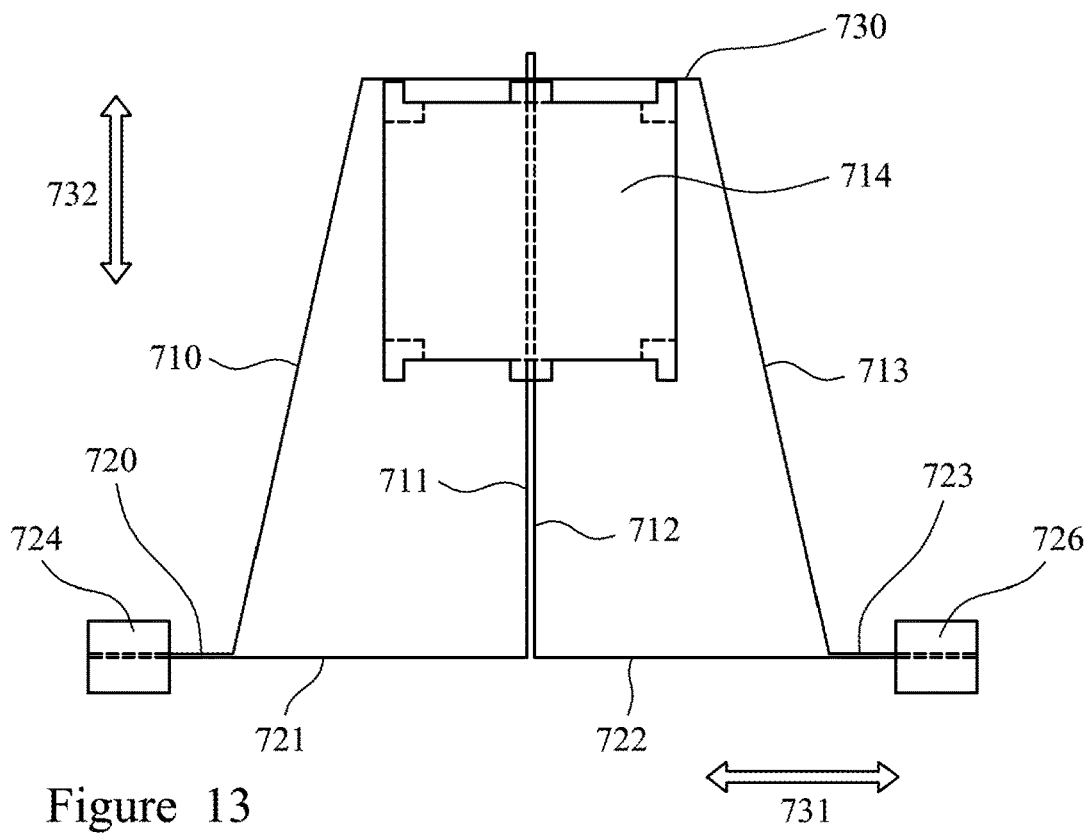
FIG. 13 is a side view of a seventh embodiment of the invention.
Figure 14:
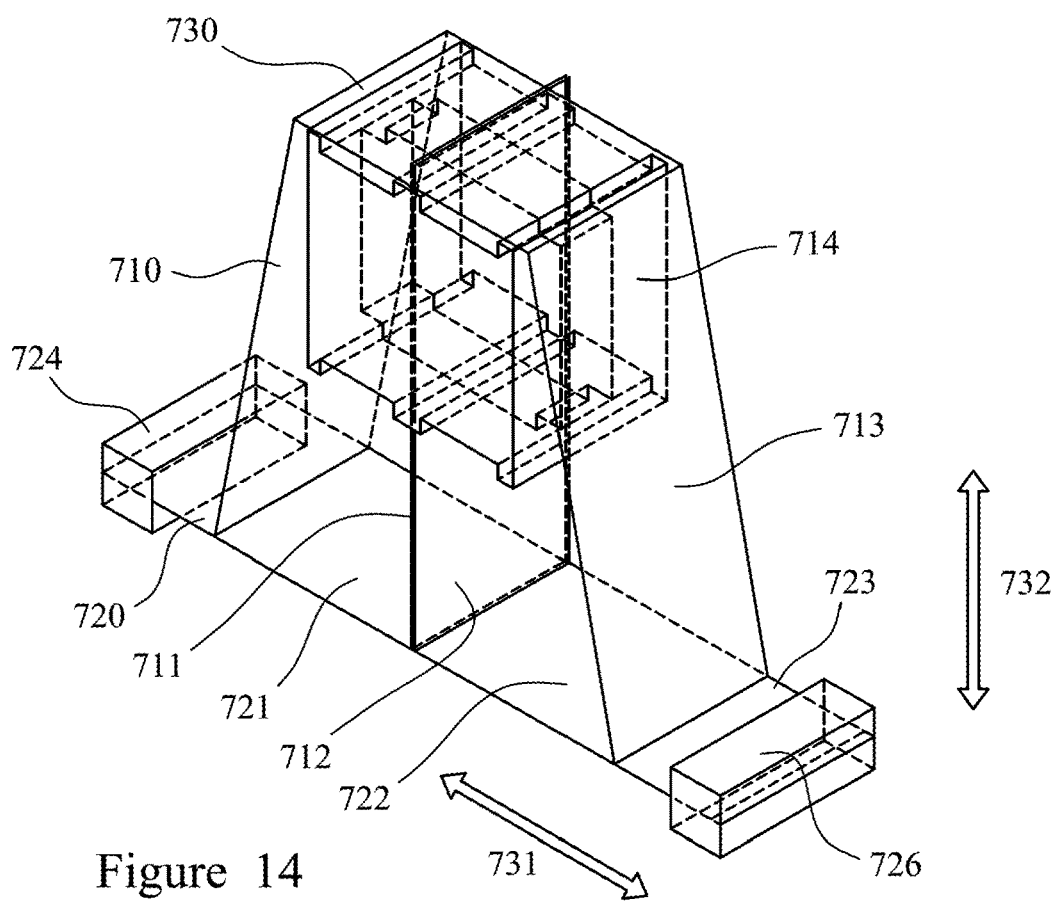
FIG. 14 is a perspective view of the seventh embodiment of the invention.

FIGS. 13 and 14 illustrate a seventh embodiment in accordance with the invention. FIG. 13 is a side view of the vibrational energy harvester. FIG. 14 is a perspective view of the vibrational energy harvester of FIG. 13, with the elements shown in transparent form for ease of understanding. The seventh embodiment is very similar to the sixth embodiment, but two of the primary flexures are oblique to the other two primary flexures. This reduces the overall size of the energy harvester compared to the embodiment of FIGS. 11 and 12, and changes the resonant frequency of the first and second modes and the loci of the mass.

In the seventh embodiment, the proof mass assembly 714 comprises an electromagnetic transducer consisting of a pair of magnets arranged on each side of a coil (not shown) with their poles in a opposed relationship to provide a well contained magnetic field across the coil. Motion of the magnets on the flexure assembly provides a varying magnetic flux across the coil, inducing an electrical current in the coil.

In the seventh embodiment, primary flexures 711 and 712 are parallel with each other and are fixed to a proof mass assembly 714. Primary flexures 711 and 712 extend beyond the proof mass assembly. But primary flexures 710 and 713 are not parallel to primary flexures 711 and 712. Primary flexures 711 and 712 may be spaced from one another.

Secondary flexures 720, 721, 722 and 723 extend from anchors 724 and 726. The anchors 724 and 726 are located on opposite sides of the proof mass assembly. Each secondary flexure is integral with a primary flexure. In FIGS. 13 and 14, secondary flexure 720 is integral with primary flexure 710, secondary flexure 721 is integral with primary flexure 711, secondary flexure 722 is integral with primary flexure 712 and secondary flexure 723 is integral with primary flexure 713. Each flexure assembly is formed from a sheet of spring steel that is shaped to form the primary and secondary flexures. Primary flexures 711 and 712 extend orthogonal to secondary flexures 721 and 722 respectively when in a rest position. Primary flexures 710 and 713 extend at an obtuse angle to secondary flexures 720 and 723. A further flexure 730 is positioned such that it connects the free ends of primary flexures 710, 711, 712 and 713. The shape of the flexures may therefore be described as a combination of T and V shapes.

When the vibrational energy harvester undergoes vibration in a first direction, indicated by arrow 731, the proof mass assembly moves in direction 731, driven by the directly excited flexures in a first mode. When the vibrational energy harvester undergoes vibration in direction 732, the proof mass assembly moves in direction 732, driven by the directly excited flexures in a second mode.

The primary and secondary flexures are also designed so that oscillation in the second mode can drive the flexures in parametric resonance in the first mode. A parametric mode of operation can provide more efficient conversion of vibration energy into electrical energy. In order to make a parametric mode of vibration more likely the resonant frequencies of the first and second modes are matched. If a resonant frequency of the primary flexure is $\omega_1$ and a resonant frequency of the secondary flexure is $\omega_2$, then $\omega_2$ may be substantially equal to $2\omega_1/n$ where n is an integer.

Figure 15:
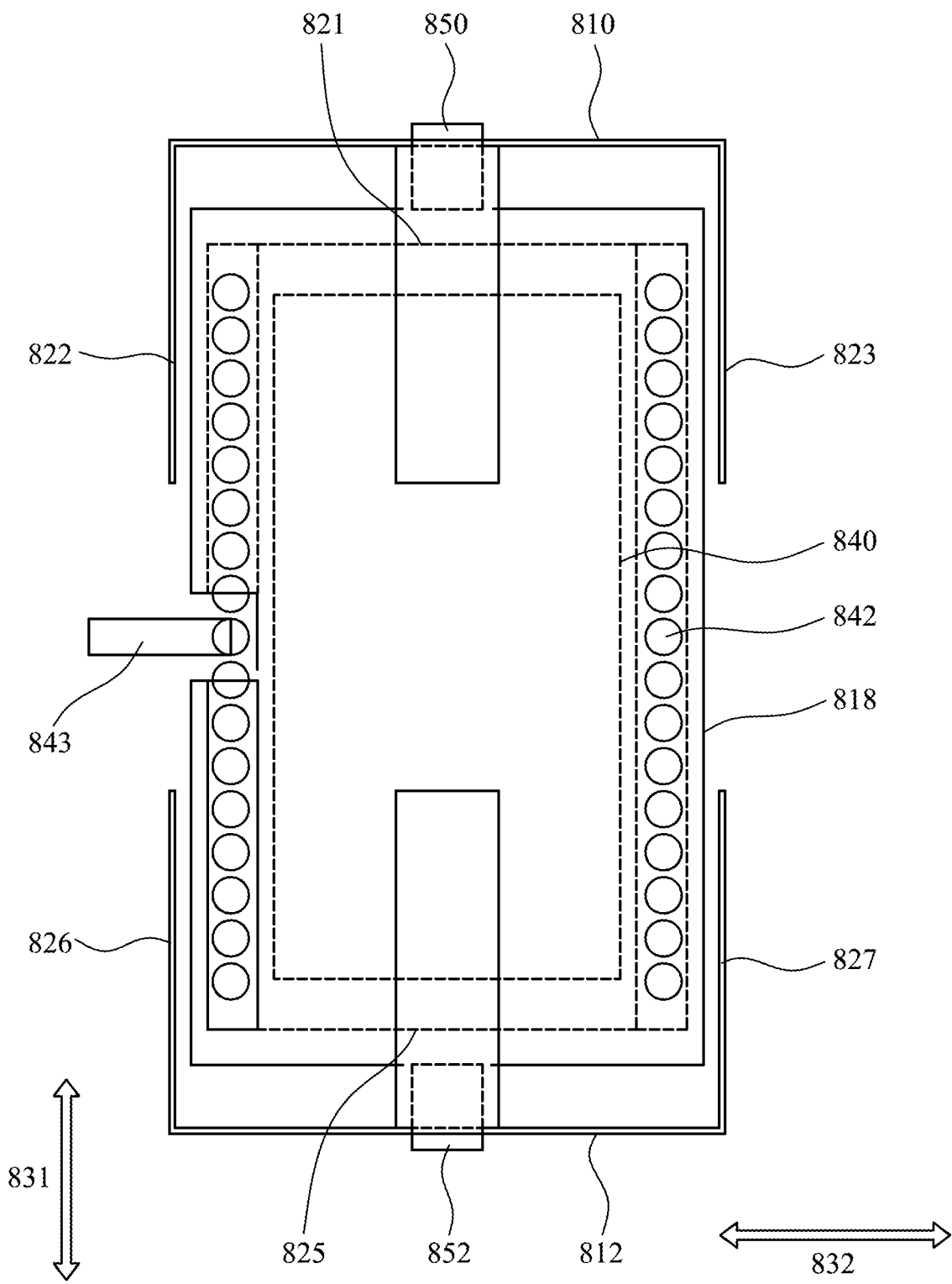
FIG. 15 is a side view of an eighth embodiment of the invention.
Figure 16:
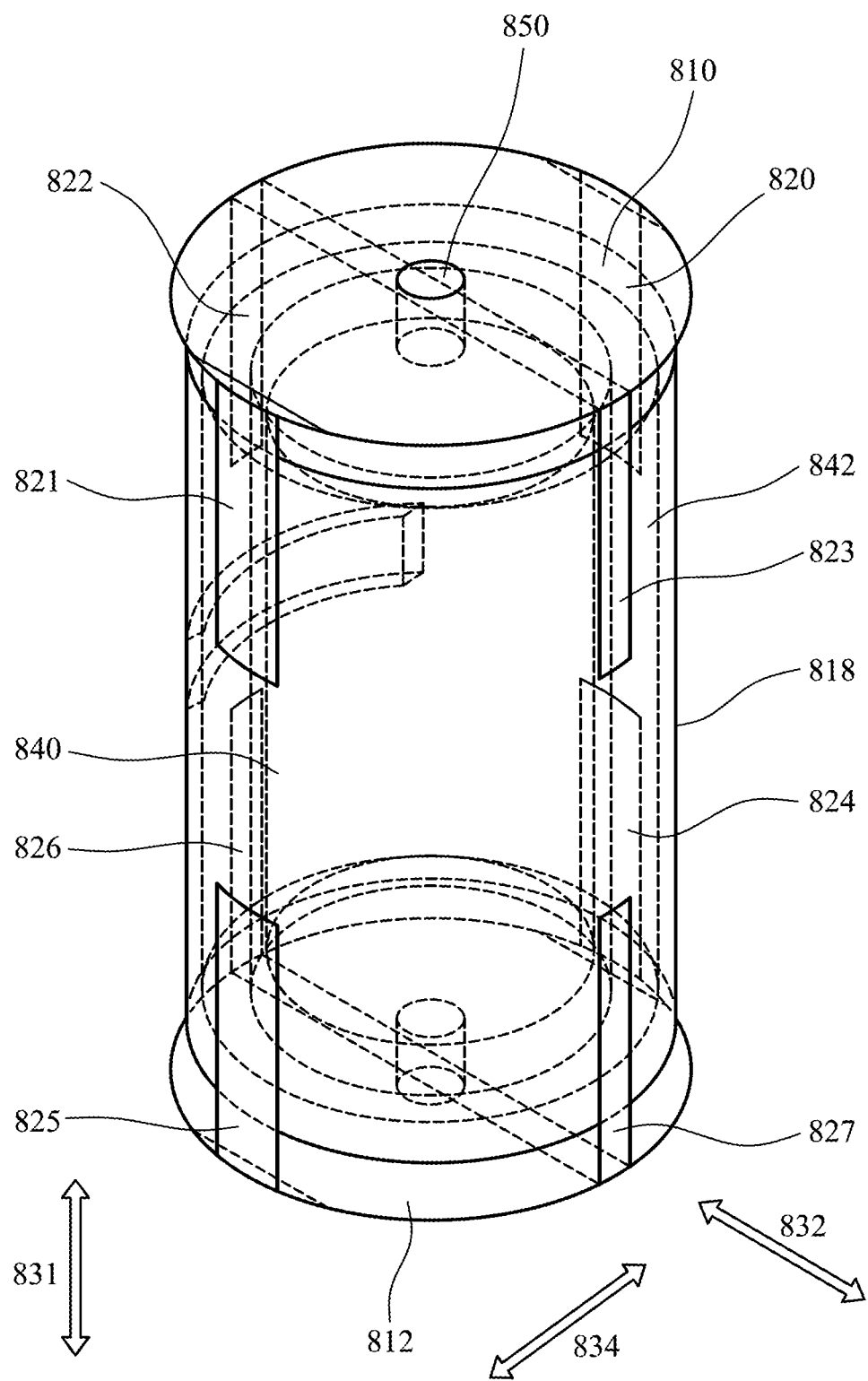
FIG. 16 is a perspective view of the eighth embodiment of the invention.

FIGS. 15 and 16 illustrate an eighth embodiment in accordance with the invention. FIG. 15 is a side view of the vibrational energy harvester. FIG. 16 is a perspective view of the vibrational energy harvester of FIG. 15, with the elements shown in transparent form for ease of understanding. FIG. 16 illustrates that the eighth embodiment is cylindrical.

In the eighth embodiment, the vibrational energy harvester comprises a generally cylindrical frame or housing 818. The transduction assembly 814 is held within the housing and comprises an electromagnetic transducer including magnets 840 and a coil 842 as in previous embodiments. The coil 842 is fixed relative to the housing. This is shown only schematically and in dotted line in FIGS. 15 and 16 for ease of understanding.

The mass and magnets of the transduction assembly are connected to a pair of parallel, axially spaced primary flexures, which are substantially identical, circular membrane flexures 810, 812. The mass and magnets 840 are fixed to a centre point of each membrane flexure 810, 812 by fixtures 850, 852.

Membrane flexure 810 is connected to the housing 818 by four circumferentially spaced secondary flexures 820, 821, 822, 823, extending orthogonal to the membrane flexure 810. The secondary flexures are simple cantilever beams 812. Similarly, the membrane flexure 812 is connected to the housing 818 by four circumferentially spaced secondary flexures 824, 825, 826 and 827. The secondary flexures are all substantially identical to each other and equally spaced apart around the periphery of a membrane flexure.

The primary flexures 810, 812 may be integrally formed with the secondary flexures connected to it. The primary and secondary flexures are spaced from the housing 818 to allow for flexing without interference with the housing. When the vibrational energy harvester undergoes vibration in a first direction, indicated by arrow 831, the proof mass assembly moves in direction 831, driven by the directly excited primary flexures. This moves the magnets relative to coil, inducing a current in the coil in the same manner as described with reference to the previous embodiments. The current is output through output port 843.

Vibration in any direction orthogonal to the first direction, as indicated by arrows 832 and 834, may directly drive some or all of the secondary flexures to parametrically excite the primary flexures 810, 812, again driving the magnets in the first direction relative to the coil. In order to make a parametric mode of vibration more likely the resonant frequencies of the various modes of vibration are matched. If a resonant frequency of the first mode, which is directly excited by vibration in the first direction 831, is $\omega_1$ and a resonant frequency of the second mode, which is directly driven by vibration orthogonal to the first direction, is $\omega_2$, then $\omega_2$ may be substantially equal to $2\omega_1/n$, where n is an integer.

This design allows the vibrational energy harvester to harvest energy form vibration in any direction. All three axes of vibration can be harvested.

The use of two spaced membranes improves the chances of the membranes entering parametric resonance by pushing the frequency of unwanted modes, which may interfere with parametric mode operation, such as twisting modes, far above the expected band of frequencies of operation.

In this embodiment each membrane flexure is coupled to four secondary flexures extending orthogonal to the membrane surface. A different number of secondary flexures may be employed, and the secondary flexures may extend in a different orthogonal direction, or may extend obliquely, as described with reference to the previous embodiment.

Figure 17:
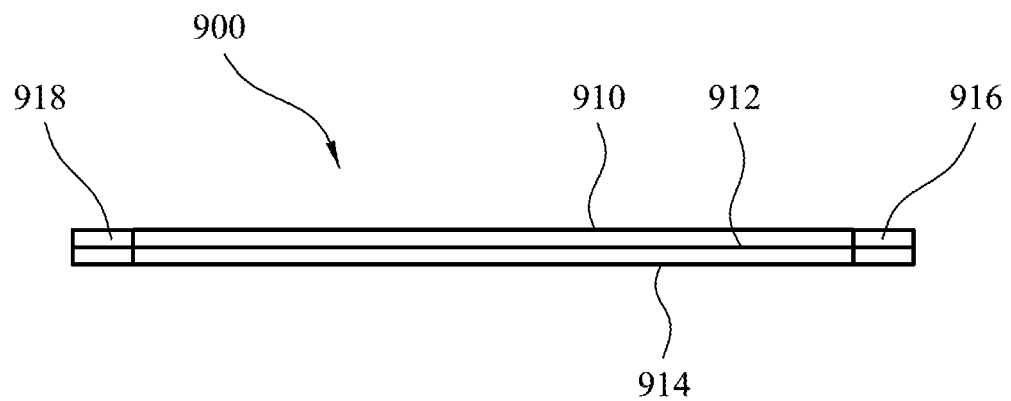
FIG. 17 is an illustration of a multi-layer flexure for use in any of the described embodiments.
Figure 18:
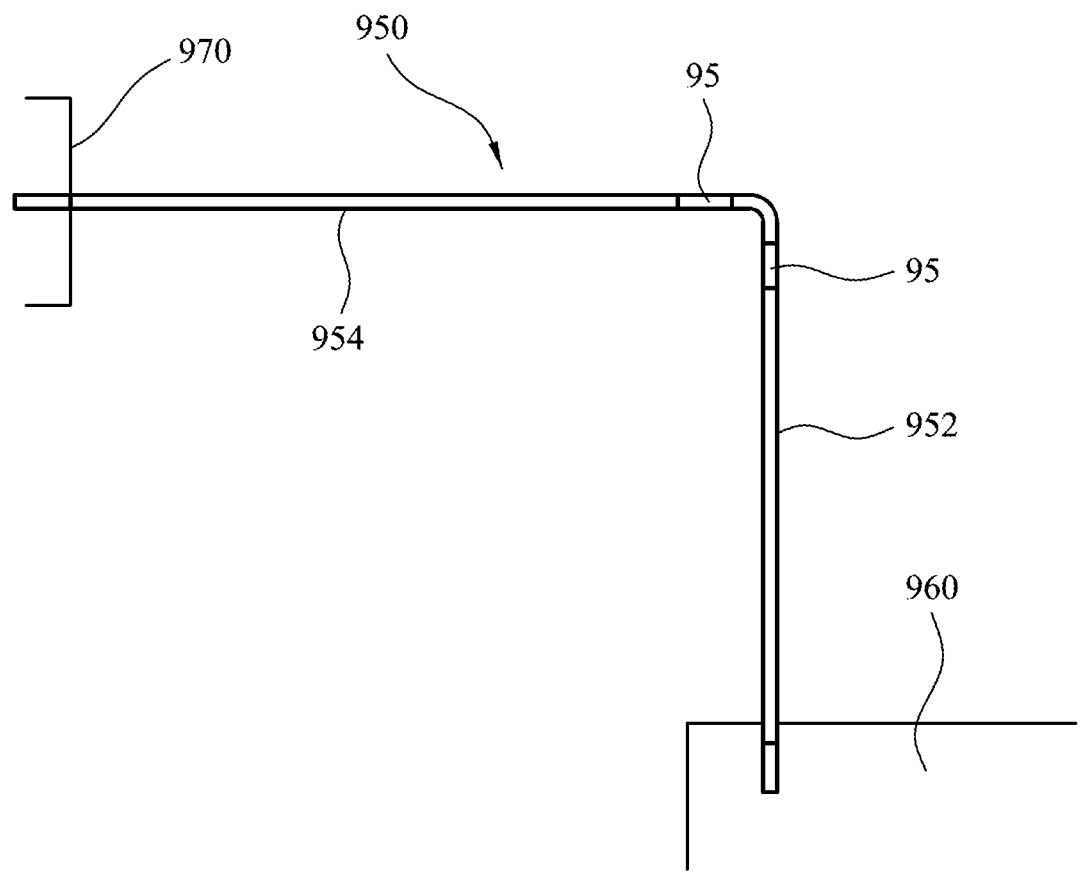
FIG. 18 is an illustration of a multi-layer flexure assembly.

In the embodiments described, each of the flexure assemblies have been described as one-piece structures formed from a resilient material such as spring steel. However, it may be advantageous to use flexures made from two or more flexure elements arranged in a layered structure. FIG. 17 is a schematic illustration of a flexure formed from a layered arrangement of flexure elements. FIG. 17 shows a flexure 900 comprising three flexure elements, 910, 912, 914 arranged in a stack. The flexure elements 910, 912, 914 are identical to each other and formed from spring steel. They are spaced from each other by spacers 916, 918, also formed from spring steel. A layered flexure constructed in this manner can allow for greater maximum displacement of the flexure without exceeding fatigue limits, and so allows for greater energy harvesting capability. A layered flexure of this type may be used for one or more of the flexures in any of the previously described embodiments FIG. 18 is a schematic illustration of a layers flexure assembly comprising a primary and a secondary flexure. The flexure assembly 950 of FIG. 18 comprises two spaced flexure elements 952, 954 separated by spacer elements 956. The flexure elements 952, 954 are bent to form primary and secondary flexures, and are connected between a mass 960 and a frame 970. The spacers and flexure elements are formed from spring steel.

The embodiments described use a magnet and coil transduction assembly. However, it should be clear that different transduction techniques may be used, such as electrostatic transduction and piezoelectric transduction.

It should also be clear that the topologies described may be implemented as a MEMS (micro electromechanical systems) device and formed from silicon.

It should also be clear that, although the embodiments described comprise primary and secondary flexures that illustrated as joined at sharp bends, it is possible to use continuously curved structures that serve as both primary and secondary flexures in a single piece, with different portions of the continuously curved structure extending in different directions and allowing for displacement of the mass in different directions. In other words, a radius of curvature of a join between primary and secondary flexures can be very small (much smaller than a length of the flexure assembly), in the case of an L-shaped or V-shaped structures illustrated for example, or may be large (of the same order of magnitude as the length of the flexure assembly itself), in a continuously curved structure, or may have a radius of curvature intermediate these two extremes. It should also be clear that it is possible to use different types of flexure assembly structure within the same energy harvester. For example, a first primary and secondary flexure pair may be formed from a continuously curved flexure assembly while a second primary and secondary flexure pair may be formed from two straight flexures joined at a sharp junction.

The invention claimed is:

1. A vibrational energy harvester comprising:
    a frame;
    first and second primary flexures,
    a mass, the mass being coupled to both the first and second primary flexures;
    wherein the first and second primary flexures are configured to flex to allow the mass to move in a first direction, and separated from one another in the first direction;
    a plurality of secondary flexures, each of the primary flexures being fixed to a secondary flexure at a position spaced from the mass, and coupling the primary flexure to the frame, wherein each of the secondary flexures is configured to flex to allow the mass to move in a second direction different to the first direction;
    wherein the first and second primary flexures each have a length extending in the second direction, a thickness extending in the first direction, and a width extending in a third direction orthogonal to the first direction and to the second direction, wherein the length and the width are greater than the thickness of the first and second primary flexures, and
    wherein the secondary flexures each have a length extending in the first direction, a thickness extending in the second direction, and a width extending in the third direction, wherein the length and the width are greater than the thickness of the secondary flexures,
    such that none of the flexures in the vibrational energy harvester are configured to flex in the third direction; and
    a transduction assembly configured to convert movement of the mass and primary and secondary flexures into electrical energy.

2. A vibrational energy harvester according to claim 1, wherein the first and second primary flexures extend substantially orthogonal to the first direction.

3. A vibrational energy harvester according to claim 1, wherein the first and second primary flexures are parallel to one another.

4. A vibrational energy harvester according to claim 1, wherein in a rest position both the primary flexures are in an unstrained configuration.

5. A vibrational energy harvester according to claim 1, wherein the second direction is orthogonal to the first direction.

6. A vibrational energy harvester according to claim 1, wherein the primary flexures are cantilever flexures.

7. A vibrational energy harvester according to claim 1, wherein the primary flexures each have opposite first and second ends, the opposite first and second ends each coupled to a secondary flexure, and wherein the mass is fixed to a mid-point of each of the primary flexures.

8. A vibrational energy harvester according to claim 1, wherein the primary flexures are membrane flexures.

9. A vibrational energy harvester according to claim 8, wherein the mass is fixed to a central portion of each primary flexure and a periphery of each primary flexure is coupled to a plurality of secondary flexures.

10. A vibrational energy harvester according to claim 8, wherein the mass is fixed to a periphery of each primary flexure and a central portion of each primary flexure is coupled to a secondary flexure.

11. A vibrational energy harvester according to claim 1 wherein in a rest position all of the secondary flexures are in an unstrained configuration.

12. A vibrational energy harvester according to claim 1, wherein each of the secondary flexures extends in a direction orthogonal to the primary flexure.

13. A vibrational energy harvester according to claim 1, wherein each of the secondary flexures comprises a cantilever beam.

14. A vibrational energy harvester according to claim 1, wherein the primary flexures are coupled to the frame only through one or more of the secondary flexures.

15. A vibrational energy harvester according to claim 1, wherein each of the secondary flexures extends in the same direction.

16. A vibrational energy harvester according to claim 1, wherein each of the secondary flexures coupled to the first primary flexure extends in a direction opposite to each of the secondary flexures coupled to the second primary flexure.

17. A vibrational energy harvester according to claim 1, wherein each primary flexure together with the secondary flexures coupled to it, forms an auto-parametric resonator.

18. A vibrational energy harvester according to according to claim 1, wherein one or more of secondary flexure forms a continuous curved structure with the primary flexure to which it is fixed.

19. A vibrational energy harvester according to claim 1, wherein the transduction assembly comprises a coil and at least one magnet positioned adjacent to the coil.

20. A vibrational energy harvester according to claim 19, wherein the at least one magnet forms all or part of the mass and the coil is fixed to the frame adjacent to the at least one magnet.

* * * * *